(12) United States Patent
Suzuki et al.

(10) Patent No.: US 12,176,817 B2
(45) Date of Patent: *Dec. 24, 2024

(54) POWER CONVERTER

(71) Applicant: FUJI ELECTRIC CO., LTD., Kanagawa (JP)

(72) Inventors: Yuji Suzuki, Tokyo (JP); Motohito Hori, Nagano (JP); Akio Toba, Tokyo (JP); Ikuya Sato, Kanagawa (JP); Yasuhito Tanaka, Kanagawa (JP); Masamichi Iwasaki, Tokyo (JP); Masaaki Ajima, Tokyo (JP); Nobuaki Ohguri, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/396,046

(22) Filed: Dec. 26, 2023

(65) Prior Publication Data

US 2024/0128880 A1  Apr. 18, 2024

Related U.S. Application Data

(63) Continuation of application No. 17/652,153, filed on Feb. 23, 2022, now Pat. No. 11,894,774, which is a
(Continued)

(30) Foreign Application Priority Data

Mar. 5, 2020 (JP) ................................. 2020-038108

(51) Int. Cl.
*H02M 7/00* (2006.01)
*H02M 1/32* (2007.01)
(Continued)

(52) U.S. Cl.
CPC ....... *H02M 3/33569* (2013.01); *H02M 1/327* (2021.05); *H02M 7/003* (2013.01);
(Continued)

(58) Field of Classification Search
CPC .... H02M 7/003; H02M 7/537; H02M 7/5387; H02M 7/53871
See application file for complete search history.

(56) References Cited

U.S. PATENT DOCUMENTS 9,300,221 B2 * 3/2016 Asako ................... H02M 7/003
2011/0194246 A1   8/2011 Nakasaka et al.
(Continued)

FOREIGN PATENT DOCUMENTS

CN    202652097 U    1/2013
JP    2007-082359    3/2007
(Continued)

OTHER PUBLICATIONS

International Search Report mailed on Mar. 16, 2021 with respect to PCT/JP2021/003936.
(Continued)

*Primary Examiner* — Gary A Nash
(74) *Attorney, Agent, or Firm* — IPUSA, PLLC

(57) ABSTRACT

A power converter includes a capacitor and a substrate on which a plurality of switching elements for power conversion are mounted. The power converter includes a cooler for cooling the plurality of switching elements and a housing that accommodates the capacitor, the substrate, and the cooler. The power converter includes a power connector exposed from the housing and an output connector exposed from the housing. The power converter includes a plurality of lines that include a plurality of power lines each electrically connected to the capacitor, given switching elements, and the power connector. The plurality of lines include a (Continued)

plurality of output lines each electrically connected to given switching elements and the output connector. At least one among the plurality of lines is a line that includes a conductive pattern formed on the substrate.

4 Claims, 13 Drawing Sheets

Related U.S. Application Data continuation of application No. PCT/JP2021/003936, filed on Feb. 3, 2021.

(51) Int. Cl.
*H02M 3/335* (2006.01)
*H02M 7/537* (2006.01)
*H02M 7/5387* (2007.01)

(52) U.S. Cl.
CPC .......... *H02M 7/537* (2013.01); *H02M 7/5387* (2013.01); *H02M 7/53871* (2013.01)

(56) References Cited

U.S. PATENT DOCUMENTS

| | | | |
|---|---|---|---|
| 2011/0194247 A1 | 8/2011 | Nakasaka et al. | |
| 2011/0194248 A1 | 8/2011 | Nakasaka et al. | |
| 2011/0194249 A1 | 8/2011 | Nakasaka et al. | |
| 2011/0194322 A1 | 8/2011 | Nakasaka et al. | |
| 2015/0029666 A1* | 1/2015 | Kosuga | H02M 7/003 361/699 |
| 2015/0049533 A1* | 2/2015 | Nishikimi | H05K 7/20127 363/141 |
| 2016/0037654 A1* | 2/2016 | Kosuga | H02M 7/003 361/807 |
| 2016/0311462 A1 | 10/2016 | Inada et al. | |
| 2017/0040907 A1* | 2/2017 | Goto | H02M 3/28 |
| 2018/0303001 A1* | 10/2018 | Suwa | H05K 7/2089 |

FOREIGN PATENT DOCUMENTS

| | | |
|---|---|---|
| JP | 2009-146933 | 7/2009 |
| JP | 2010-219137 | 9/2010 |
| JP | 2011-182628 | 9/2011 |
| JP | 2013-162017 | 8/2013 |
| JP | 2013-223384 | 10/2013 |
| JP | 2015-116095 | 6/2015 |
| JP | 2016-015863 | 1/2016 |
| JP | 2018-191388 | 11/2018 |
| JP | 2019-134591 | 8/2019 |

OTHER PUBLICATIONS

Written Opinion of The International Searching Authority mailed on Mar. 16, 2021 with respect to PCT/JP2021/003936.
Office Action mailed on Sep. 24, 2024 issued with respect to the corresponding Chinese Patent Application No. 202180005079.5.

* cited by examiner

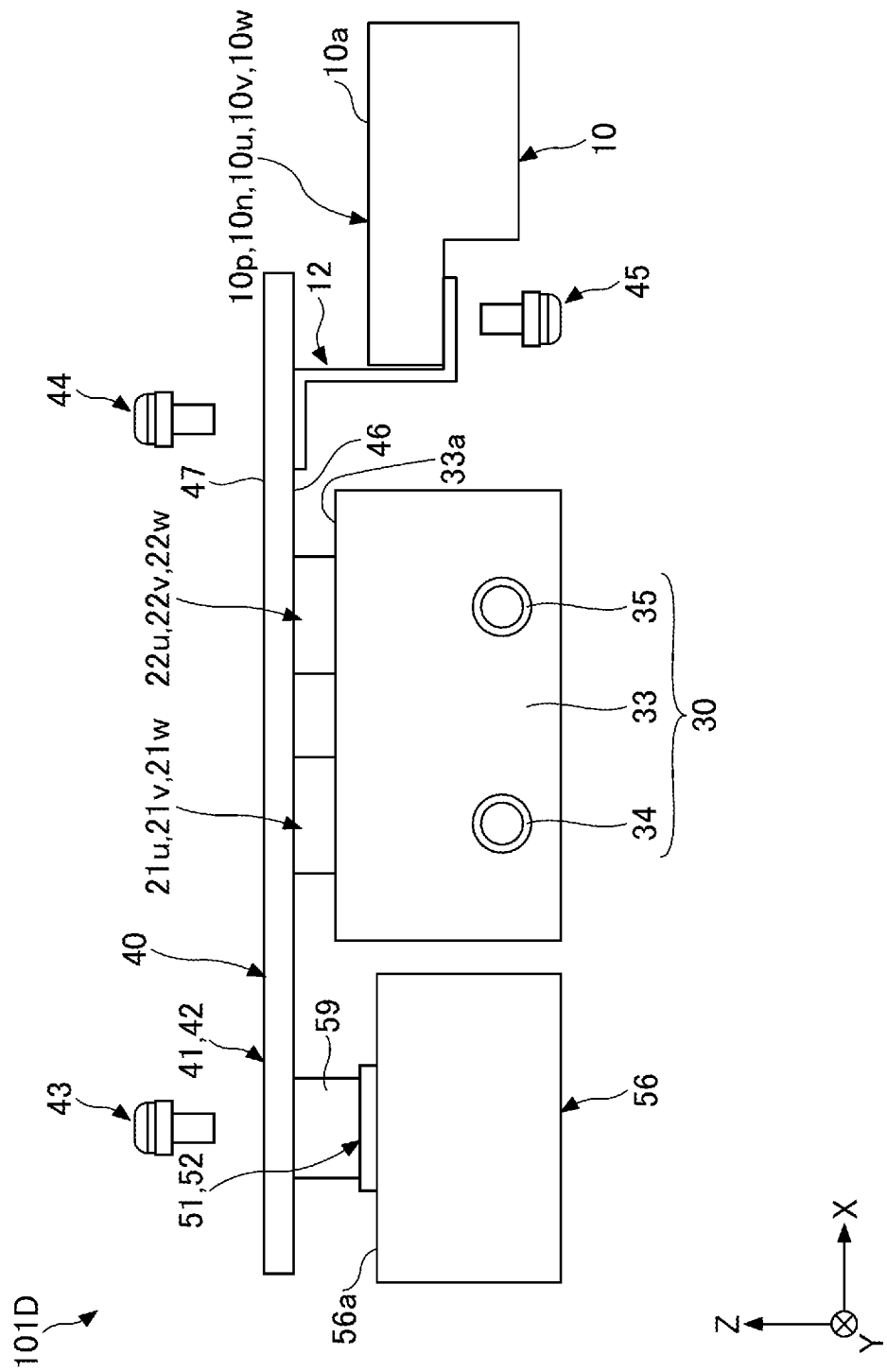

POWER CONVERTER

CROSS-REFERENCE TO RELATED APPLICATIONS

The present application is a continuation application of and claims the benefit of priority under 35 U.S.C. § 120 of U.S. patent application Ser. No. 17/652,153, filed Feb. 23, 2022, which claims priority to International Application No. PCT/JP2021/003936, filed Feb. 3, 2021, and designated the U.S., which claims priority to Japanese Patent Application No. 2020-038108, filed Mar. 5, 2020, the entire contents of which are incorporated herein by reference.

BACKGROUND

1. Field of the Invention

The present disclosure relates to a power converter.

2. Description of the Related Art

A power converter is known to include an electrical component mounted on a circuit board, a heat sink for releasing heat generated by the electrical component, and a box-like housing that accommodates the electrical component and the heat sink (see, for example, Patent Document 1). Also, a power converter is known to include a cooler that cools a plurality of semiconductor modules and to include a support frame provided on the cooler, where the plurality of semiconductor modules are supported by a support frame (see, for example, Patent Document 2). Further, a power converter is known to include a plurality of semiconductor modules, a cooler that cools the plurality of semiconductor modules, and a case that accommodates the plurality of semiconductor modules and the cooler (see, e.g., Patent Document 3).

CITATION LIST

Patent Document

[Patent Document 1] Japanese Unexamined Patent Application Publication No. 2018-191388
[Patent Document 2] Japanese Unexamined Patent Application Publication No. 2016-15863
[Patent Document 3] Japanese Unexamined Patent Application Publication No. 2011-182628

SUMMARY

A connector exposed from the housing of the power converter may be required to be repositioned by an end user or the like. However, when additional design modifications, such as layout changes of internal components of the power converter, are made due to the repositioning of the connector, losses or the like in the time or cost caused by the additional design modifications may result.

The present disclosure provides a power converter that can flexibly deal with a design modification due to repositioning of a connector.

In the present disclosure, a power converter is provided. The power converter includes a capacitor and a substrate on which a plurality of switching elements for power conversion are mounted. The power converter includes a cooler for cooling the plurality of switching elements and a housing that accommodates the capacitor, the substrate, and the cooler. The power converter includes a power connector exposed from the housing and an output connector exposed from the housing. The power converter includes a plurality of lines that include a plurality of power lines each electrically connected to the capacitor, given switching elements, and the power connector. The plurality of lines include a plurality of output lines each electrically connected to given switching elements and the output connector. At least one among the plurality of lines is a line that includes a conductive pattern formed on the substrate.

In the present disclosure, a power converter that can flexibly deal with a design modification due to repositioning of a connector can be provided.

BRIEF DESCRIPTION OF THE DRAWINGS

FIG. 13 is a front view of an example of the power converter according to a fourth modification of the embodiment.

DESCRIPTION OF THE EMBODIMENTS

Embodiments of the present disclosure will be described below with reference to the drawings. For directions relating to the terms of parallel, a right angle, perpendicular, horizontal, vertical, up and down, left and right, and the like, deviation may be tolerable to an extent to which the effect of the present disclosure is not impaired. An X-axis direction, a Y-axis direction, and a Z-axis direction respectively refer to a direction parallel to an X-axis, a direction parallel to a Y-axis, and a direction parallel to a Z-axis. The X-axis direction, the Y-axis direction, and the Z-axis direction are mutually perpendicular to one another. An XY-plane, a YZ-plane, and a ZX-plane respectively refer to a virtual plane parallel to the X-axis direction and Y-axis direction, a virtual plane parallel to the Y-axis direction and Z-axis direction, a virtual plane parallel to the Z-axis direction and the X-axis direction. The shape of each component illustrated in each figure is one example, and the present disclosure is not limited to this example.

Figure 1:
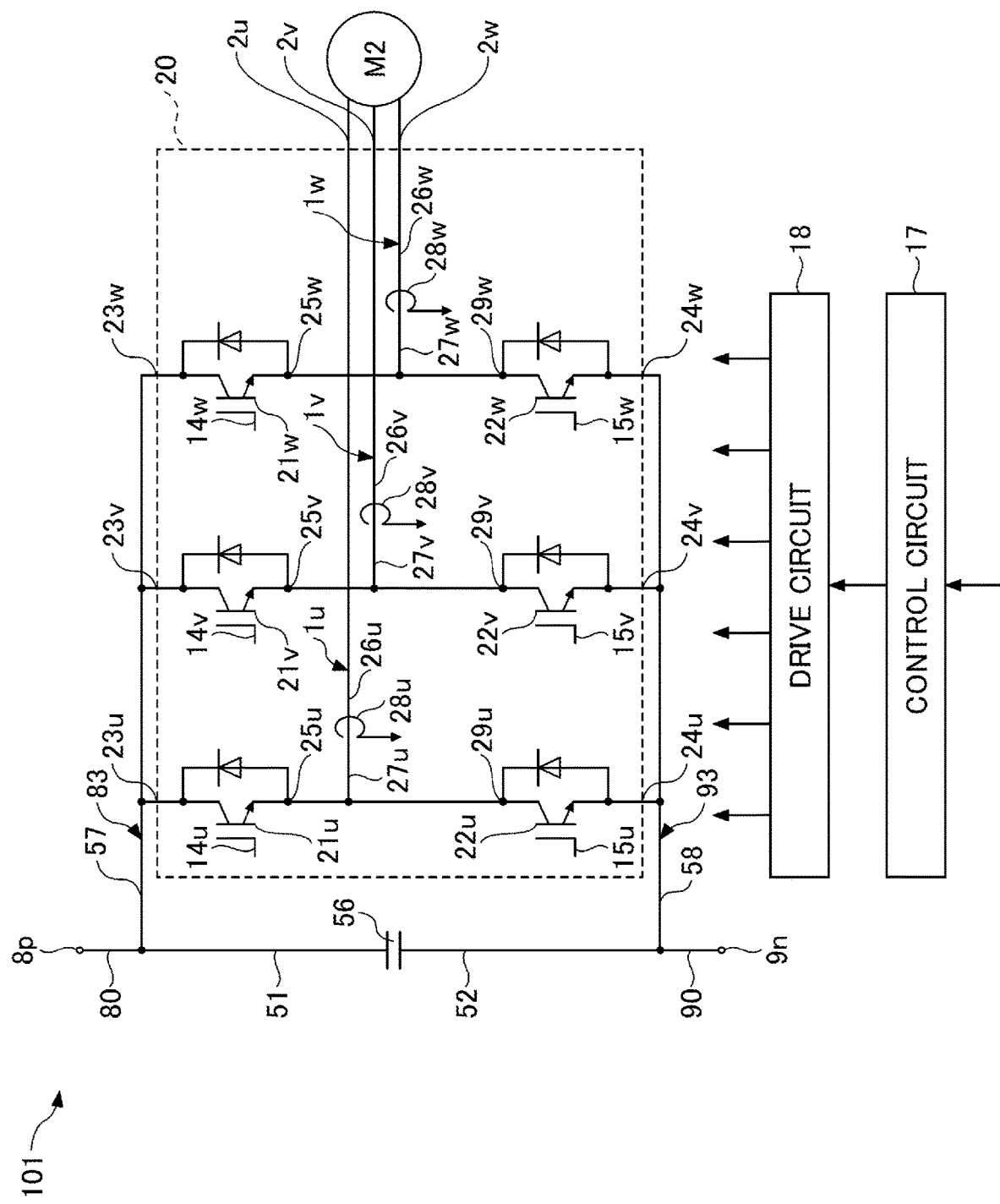
FIG. 1 is a circuit diagram illustrating an example of the configuration of a power converter according to one embodiment.

FIG. 1 is a circuit diagram illustrating an example of the configuration of a power converter according to one embodiment. A power converter 101 illustrated in FIG. 1 is an inverter that converts, into desired AC output power, DC input power that is supplied from a positive terminal 8p and a negative terminal 9n that are a pair of power supply terminals. For example, the power converter 101 is used as an inverter that drives a motor M2 for rotating vehicle wheels. Intended use of the power converter in the present disclosure is not limited to this example.

The power converter 101 includes the positive terminal 8p, the negative terminal 9n, a plurality of output terminals 2u, 2v, and 2w, a capacitor 56, and a power conversion circuit 20. The power converter 101 includes a positive line 83, a negative line 93, a plurality of current sensors 28u, 28v, and 28w, a control circuit 17, and a drive circuit 18. The positive line 83 includes a first positive line 80 and a second positive line 57. A negative line 93 includes a first negative line 90 and a second negative line 58. The control circuit 17, or both the control circuit 17 and the drive circuit 18, may be provided in an external device different from the power converter 101.

The positive terminal 8p and the negative terminal 9n are external terminals to which a DC supply voltage is applied by a DC power supply not illustrated. A potential at the positive terminal 8p is higher than that at the negative terminal 9n. A specific example of the DC power supply includes a battery, a converter, a regulator, or the like.

The output terminals 2u, 2v, and 2w are external terminals for receiving and outputting three-phase AC power, and a motor M2 is connected to the output terminals 2u, 2v, and 2w.

The capacitor 56 is a capacitive element that smooths the DC supply voltage to be applied between the positive terminal 8p and the negative terminal 9n. A specific example of the capacitor 56 includes an electrolytic capacitor or the like. The capacitor 56 includes a first capacitor electrode 51 and a second capacitor electrode 52. The first capacitor electrode 51 is a terminal electrically connected to the positive line 83 (the first positive line 80 and the second positive line 57), and the second capacitor electrode 52 is a terminal electrically connected to the negative electrode line 93 (the first negative line 90 and the second negative electrode line 58).

The power conversion circuit 20 is an inverter circuit that converts, into three-phase AC power to be supplied to the motor M2, DC power input to the positive line 83 and the negative line 93 from the positive terminal 8p and the negative terminal 9n.

The power conversion circuit 20 is a three-phase bridge circuit that has a plurality of switching elements 21u, 21v, 21w, 22u, 22v, 22w, and 22w, and generates three-phase AC power by switching the switching elements 21u, 21v, 21w, 22u, 22v, and 22w. The power conversion circuit 20 includes the switching elements 21u, 21v, 21w, 22u, 22v, 22w and a plurality of output lines 1u, 1v, and 1w.

The switching elements 21u and 22u that are in a U-phase are connected in series, and a connection node that is intermediate between these switching elements is connected to the output terminal 2u that is in the U-phase and is connected to a U-phase coil of the motor M2. The switching elements 21v and 22v that are in a V-phase are connected in series, and a connection node that is intermediate between these switching elements is connected to the output terminal 2v that is in a V-phase and is connected to a V-phase coil of the motor M2. The switching elements 21w and 22w that are in a W-phase are connected in series, and a connection node that is intermediate between these switching elements is connected to the output terminal 2w that is in a W-phase and is connected to a W-phase coil of the motor M2.

The switching elements 21u, 21v, and 21w are semiconductor elements that respectively include first main electrodes 23u, 23v, and 23w, second main electrodes 25u, 25v, and 25w, and first control electrodes 14u, 14v, and 14w. The first main electrodes 23u, 23v, and 23w are each electrically connected to the second positive line 57. The second main electrodes 25u, 25v, and 25w are electrically connected to the output lines 1u, 1v, and 1w, respectively, and are electrically connected to the output terminals 2u, 2v, and 2w via the output lines 1u, 1v, and 1w, respectively. The first control electrodes 14u, 14v, and 14w are each electrically connected to the drive circuit 18.

The switching elements 22u, 22v, and 22w are semiconductor elements that respectively include third main electrodes 29u, 29v, and 29w, fourth main electrodes 24u, 24v, and 24w, and second control electrodes 15u, 15v, and 15w. The third main electrodes 29u, 29v, and 29w are electrically connected to the output lines 1u, 1v, and 1w, respectively, and are electrically connected to the output terminals 2u, 2v, and 2w via the output lines 1u, 1v, and 1w, respectively. The fourth main electrodes 24u, 24v, and 24w are each electrically connected to the second negative line 58. The second control electrodes 15u, 15v, and 15w are each electrically connected to the drive circuit 18.

A diode between the first main electrode and the second main electrode is connected in antiparallel with each of the switching elements 21u, 21v, and 21w. A diode between the third main electrode and the fourth main electrode is connected in antiparallel with each of the switching elements 22u, 22v, and 22w.

The switching elements 21u, 21v, and 21w are voltage-driven semiconductor elements each of which has a control electrode (gate), a first main electrode (a collector or a drain), and a second main electrode (an emitter or a source). The switching elements 22u, 22v, and 22w are voltage-driven semiconductor elements each of which has a control electrode (gate), a third main electrode (the collector or the drain), and a fourth main electrode (the emitter or the source). A specific example of the switching element includes a MOSFET (Metal Oxide Semiconductor Field Effect Transistor), an IGBT (Insulated Gate Bipolar Transistor), or the like. FIG. 1 illustrates a case in which the switching elements 21u, 21v, 21w, 22u, 22v, and 22w are IBGTs each having a gate, a collector, and an emitter.

The switching elements 21u, 21v, 21w, 22u, 22v, and 22w may be switching elements each of which has a semiconductor such as Si (silicon), or may be switching elements each of which has a wide band gap semiconductor, such as SiC (silicon carbide), GaN (gallium nitride), $Ga_2O_3$ (gallium oxide), or diamond. By applying the wide band gap semiconductor to a given switching element, effects of reducing losses of the given switching element are increased.

Each of the positive line 83 and the negative line 93 is a conductive line member to which the DC supply voltage is applied via the positive terminal 8p and the negative terminal 9n. DC power from the DC power supply not illustrated that is connected via the positive terminal 8p and the negative terminal 9n is supplied to the positive line 83 and the negative line 93.

The positive line 83 is a conductive member that is electrically connected to the positive terminal 8p, the first capacitor electrode 51, and the first main electrodes 23u, 23v, and 23w. The positive line 83 is formed of one or more members. In this example, the positive line 83 includes the first positive line 80 and the second positive line 57. The first positive line 80 is a line member that is electrically connected between the positive terminal 8p and the first capacitor electrode 51. The second positive line 57 is a line member that is electrically connected between the first capacitor electrode 51 and each of the first main electrodes 23u, 23v, and 23w.

The negative electrode line 93 is a conductive member that is electrically connected to the negative terminal 9n, the second capacitor electrode 52, and the fourth main electrodes 24u, 24v, and 24w. The negative line 93 is formed of one or more members. In this example, the negative line 93 includes the first negative line 90 and the second negative line 58. The first negative line 90 is a line member that is electrically connected between the negative terminal 9n and the second capacitor electrode 52. The second negative line 58 is a line member that is electrically connected between the second capacitor electrode 52 and each of the fourth main electrodes 24u, 24v, and 24w.

The output line 1u is a conductive line member that is electrically connected to the output terminal 2u, the second main electrode 25u, and the third main electrode 29u. The output line 1v is a conductive line member that is electrically connected to the output terminal 2v, the second main electrode 25v, and the third main electrode 29v. The output line 1w is a conductive line member that is electrically connected to the output terminal 2w, the second main electrode 25w, and the third main electrode 29w. The output lines 1u, 1v, and 1w may be each formed from one or more members.

The current sensor 28u for the U-phase detects a U-phase current flowing through the U-phase output line 1u and outputs a U-phase current detection signal indicating the magnitude of the detected U-phase current, to the control circuit 17. The current sensor 28v for the V-phase detects a V-phase current flowing through the V-phase output line 1v and outputs a V-phase current detection signal indicating the magnitude of the detected V-phase current, to the control circuit 17. The current sensor 28w for the W-phase detects a W-phase current flowing through the W-phase output line 1v and outputs a W-phase current detection signal indicating the magnitude of the detected W-phase current, to the control circuit 17.

With use of at least two current detection signals among the U-phase current detection signal, the V-phase current detection signal, and the W-phase current detection signal, the control circuit 17 generates control signals (for example, pulse width modulation signals) for generating three-phase AC power from the DC power, by using a known method.

With use of a known method, the drive circuit 18 generates a plurality of drive signals for driving the switching elements 21u, 21v, 21w, 22u, 22v, and 22w, such that three-phase AC power is generated in accordance with the control signals supplied from the control circuit 17. The drive circuit 18 supplies these drive signals to corresponding control electrodes among the control electrodes 14u, 14v, 14w, 15u, 15v, and 15w. With this arrangement, a three-phase alternating current can flow into the motor M2.

Figure 2:
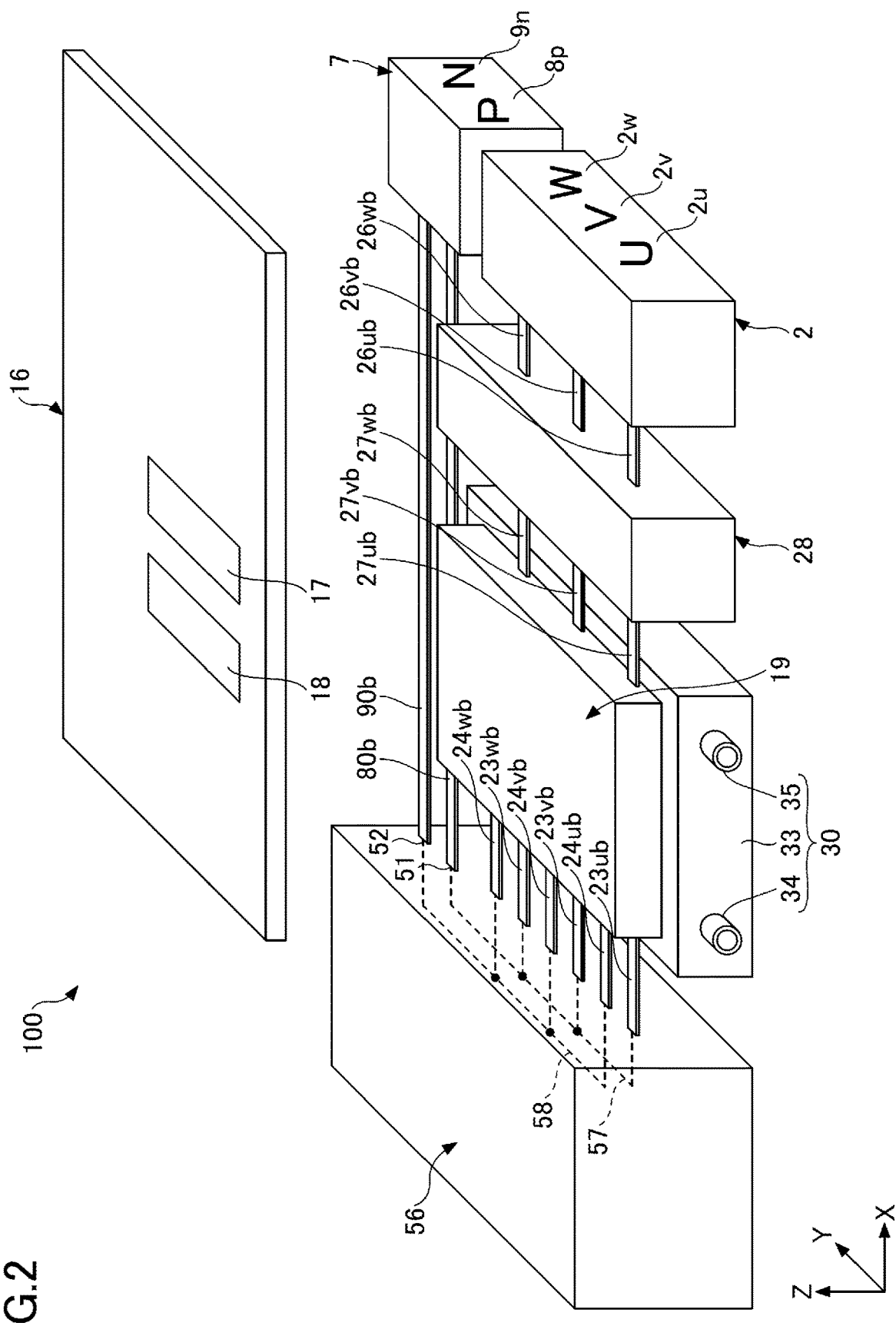
FIG. 2 is an exploded perspective view of an example of a first structure of the power converter in an comparative example.
Figure 3:
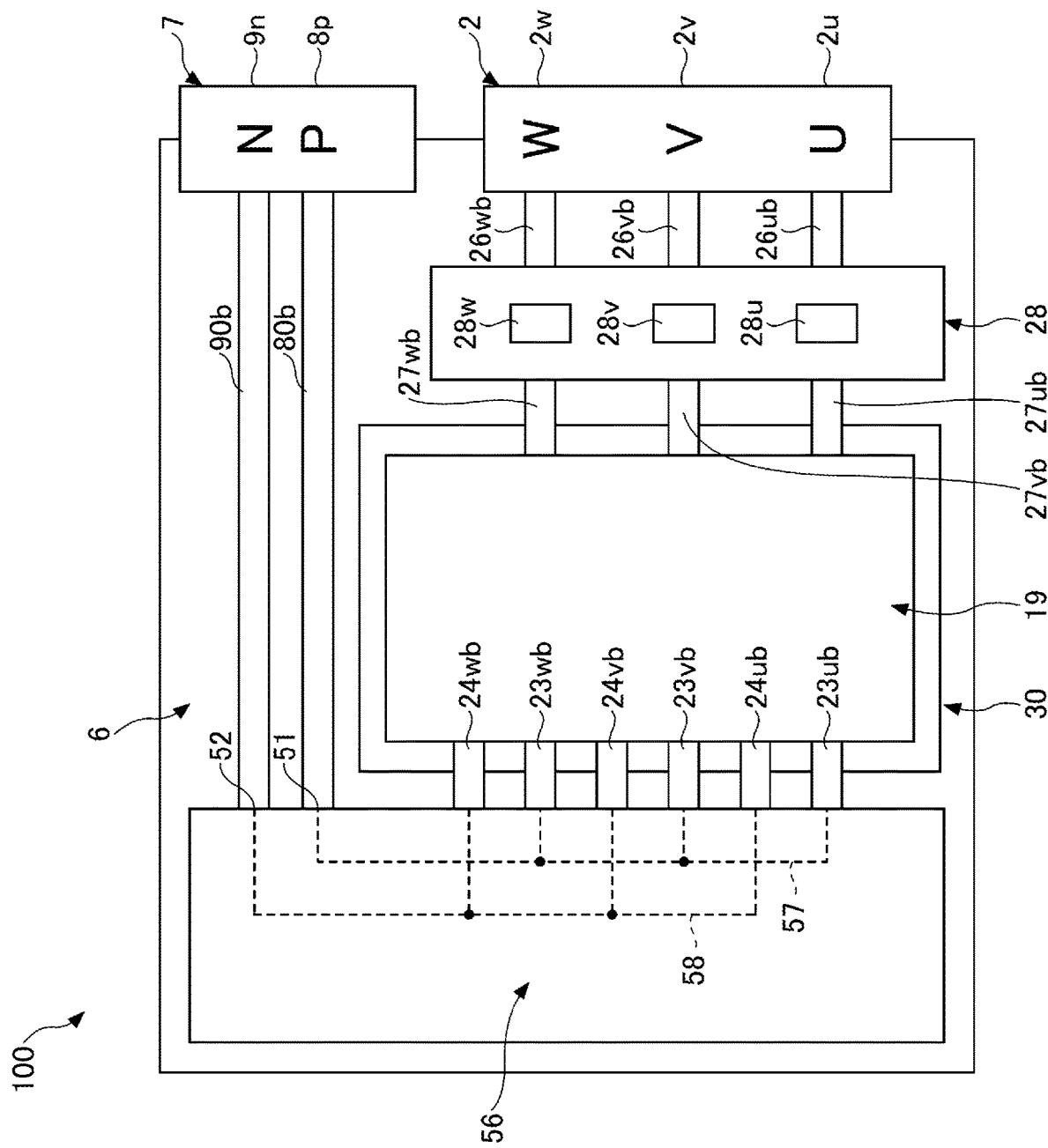
FIG. 3 is a plan view of an example of the first structure of the power converter in the comparative example.

Prior to describing the power converter according to one embodiment, an example of a first structure of the power converter in a comparative example will be hereafter described with reference to FIGS. 2 and 3. FIG. 2 is an exploded perspective view of the example of the first structure of the power converter in the comparative example. FIG. 3 is a plan view of the example of the first structure of the power converter in the comparative example. For convenience, in order to clarify an internal structure of a housing 6 that forms the outline of the power converter, illustration of the housing 6 is omitted in FIG. 2, and illustration of a control board 16 is omitted in FIG. 3. A power converter 100 in the comparative example illustrated in FIGS. 2 and 3 has the circuit configuration illustrated in FIG. 1.

The power converter 100 includes the housing 6, a power connector 7, an output connector 2, the capacitor 56, a power conversion module 19, and the control board 16. The power converter 100 includes a plurality of busbars that include a first positive busbar 80b and the like. The power converter 100 includes a current sensor module 28 and a cooler 30.

The housing 6 accommodates various internal components of the power converter 100. The power connector 7 is connected to a power supply harness not illustrated and is connected to a DC power supply not illustrated via the power supply harness. The output connector 2 is connected to the motor M2 (see FIG. 1) via the output harness not illustrated. In this example, the power connector 7 and the output connector 2 are separate members, but may be used as an integral member.

The power connector 7 is exposed from the housing 6 and is fixed to the housing 6. The power connector 7 includes the positive terminal 8p and the negative terminal 9n.

The output connector 2 is exposed from the housing 6 and is fixed to the housing 6. The output connector 2 includes the output terminals 2u, 2v, and 2w.

The capacitor 56 is accommodated in the housing 6. The capacitor 56 includes the first capacitor electrode 51 and the second capacitor electrodes 52 that are disposed apart from each other in the Y-axis direction.

The power conversion module 19 is a package component that incorporates the switching elements 21u, 21v, 21w, 22u, 22v, and 22w.

The drive circuit 18 and the control circuit 17 are mounted in the control board 16. The drive circuit 18 drives the switching elements 21u, 21v, 21w, 22u, 22v, and 22w within the power conversion module 19, such that three-phase AC power is generated in accordance with control signals supplied from the control circuit 17.

The first positive busbar 80b is a member that forms the first positive line 80 (FIG. 1) that is electrically connected between the positive terminal 8p and the first capacitor electrode 51. The first negative busbar 90b is a member that forms the first negative line 90 (FIG. 1) that is electrically connected between the negative terminal 9n and the second capacitor electrode 52.

A second positive busbar 23ub, a third positive busbar 23vb, and a fourth positive busbar 23wb are members each of which forms the second positive line 57 that is electrically connected between the first capacitor electrode 51 and a given first main electrode among first main electrodes 23u, 23v, and 23w. At least a portion of each busbar that forms the second positive line 57 is covered by the capacitor 56.

A second negative busbar 24ub, a third negative busbar 24vb, and a fourth negative busbar 24wb are members each of which forms the second negative electrode line 58 that is electrically connected between the second capacitor electrode 52 and each of fourth main electrodes 24u, 24v, and 24w. At least a portion of each busbar that forms the second negative line 58 is covered by the capacitor 56.

A first U-phase bar 27ub and a second U-phase bar 26ub are members that form the output line 1u (FIG. 1) that is electrically connected to the output terminal 2*u*, the second main electrode 25*u*, and the third main electrode 29*u*. A first V-phase bar 27*ub* and a second V-phase bar 26*ub* are members that form the output line 1*v* (FIG. 1) that is electrically connected to the output terminal 2*v*, the second main electrode 25*v*, and the third main electrode 29*v*. A first W-phase bar 27*wb* and a second W-phase bar 26*wb* are members that form the output line 1*w* (FIG. 1) that is electrically connected to the output terminal 2*w*, the second main electrode 25*w*, and the third main electrode 29*w*.

A current sensor module 28 is a package component that incorporates the current sensors 28*u*, 28*v*, and 28*w*.

The cooler 30 cools the power conversion module 19. The cooler 30 includes a cooling tube 33, a supply tube 34, and a discharge tube 35. The cooling tube 33 extends in the Y-axis direction and has one or more flow passages through which a coolant such as cooling water flows. The supply tube 34 is a member that supplies, to the cooling tube 33, the coolant flowing from an inlet port. The discharge tube 35 is a member that discharges the coolant flowing out of the cooling tube 33, from an outlet port.

In the power converter 100, the capacitor 56 and the power conversion module 19 are connected together at a shortest distance, and an output side of the power conversion module 19 is connected to the output connector 2 via the current sensor module 28. With this arrangement, various internal components are disposed next to each other as illustrated in FIGS. 2 and 3. However, a client may require to reposition input and output connectors (the power connector 7 and the output connector 2). In this case, in order to deal with repositioning of the input and output connectors, it may be necessary to change the layout of one or more components, one or more busbars, or the like, or to reposition one or more terminals of the power conversion module 19.

Figure 4:
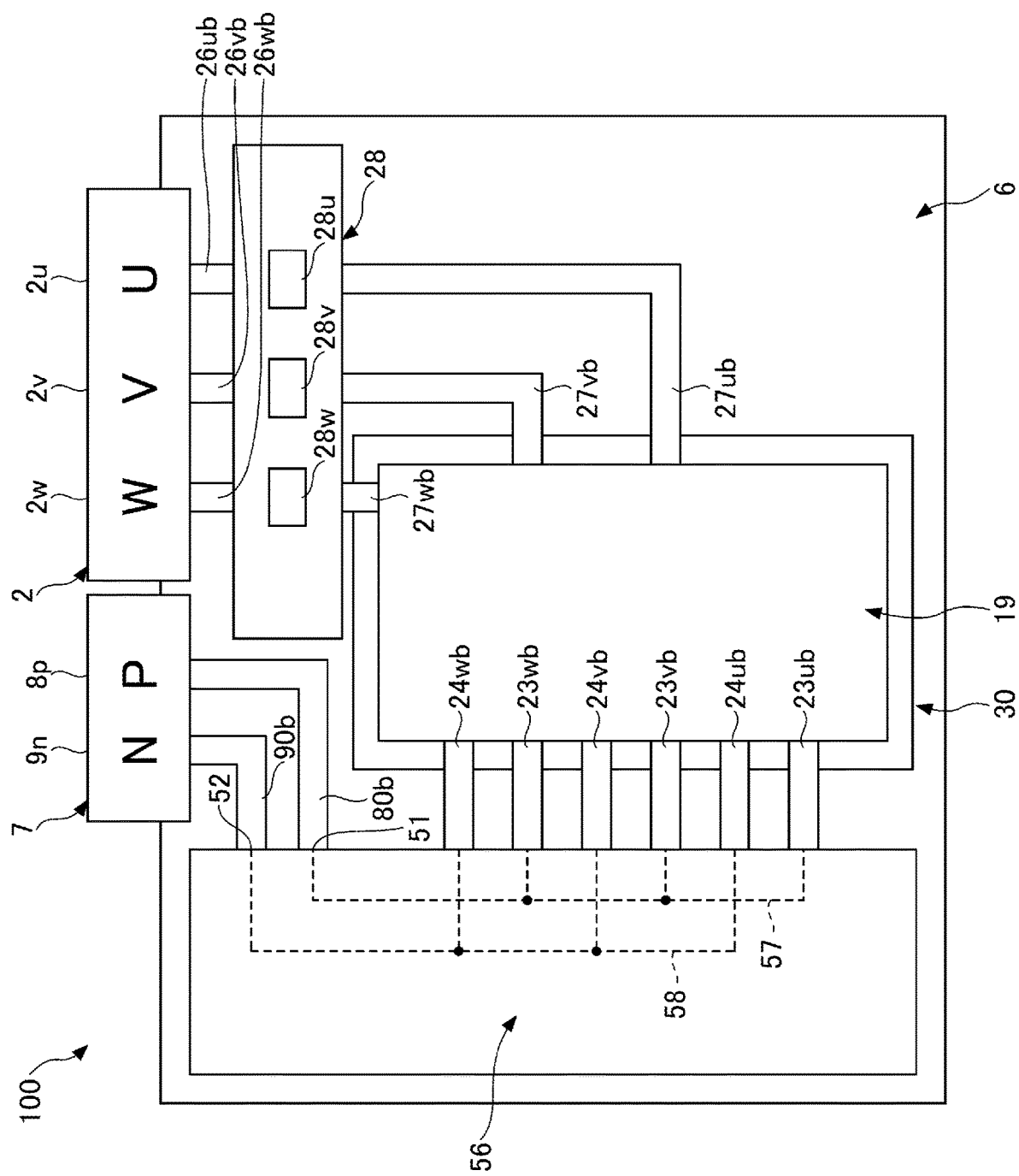
FIG. 4 is a plan view of an example of a second structure of the power converter in the comparative example.

For example, it is assumed that a client requests to change the positions of the input and output connectors from a side surface (FIG. 3) of the housing 6 in the positive X-axis direction to a side surface (FIG. 4) of the housing 6 in the positive Y-axis direction of the housing 6. In this case, positions of one or more terminals of the power conversion module 19 may need to be customized in addition to changes in the layout of the cooler 30, the power conversion module 19, the current sensor module 28, each busbar, and the like. As described above, in the power converter 100 in the comparative example, losses or the like in the time and cost caused by the additional design modification may result when the input and output connectors are repositioned.

In contrast, in the power converter according to one embodiment of the present disclosure, at least a portion of each of lines is formed by a conductive pattern formed on the substrate, without being formed from any busbar. With this arrangement, repositioning of one or more connectors can be dealt with by changing one or more conductive patterns formed on the substrate, and thus the design modification to be made due to the repositioning of the connectors can be flexibly dealt with in comparison to a manner that deals with the design modification by changing one or more busbars. Hereafter, an example of each structure of the power converter according to one embodiment will be described in detail.

Figure 5:
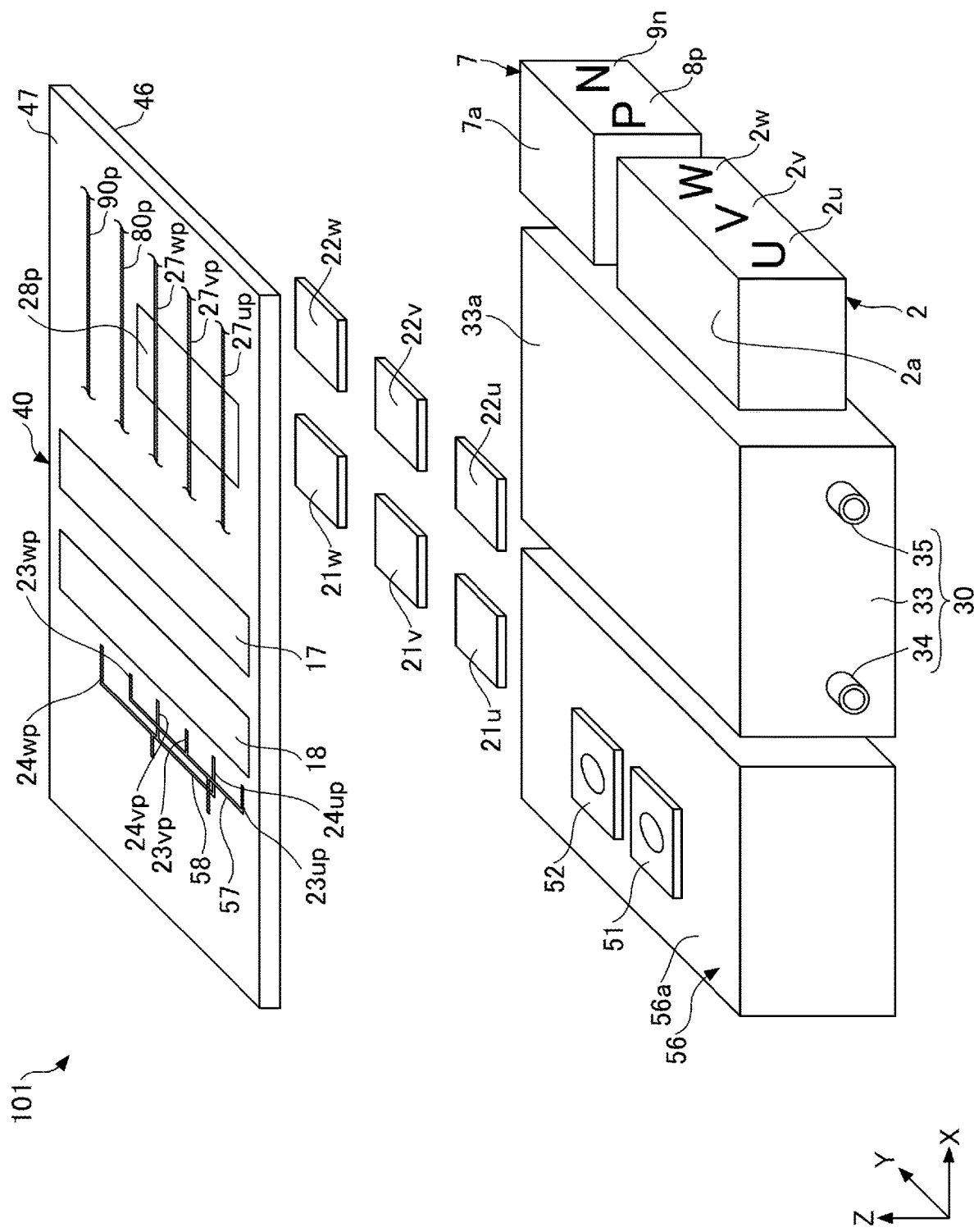
FIG. 5 is an exploded perspective view of an example of the first structure of the power converter according to one embodiment.
Figure 6:
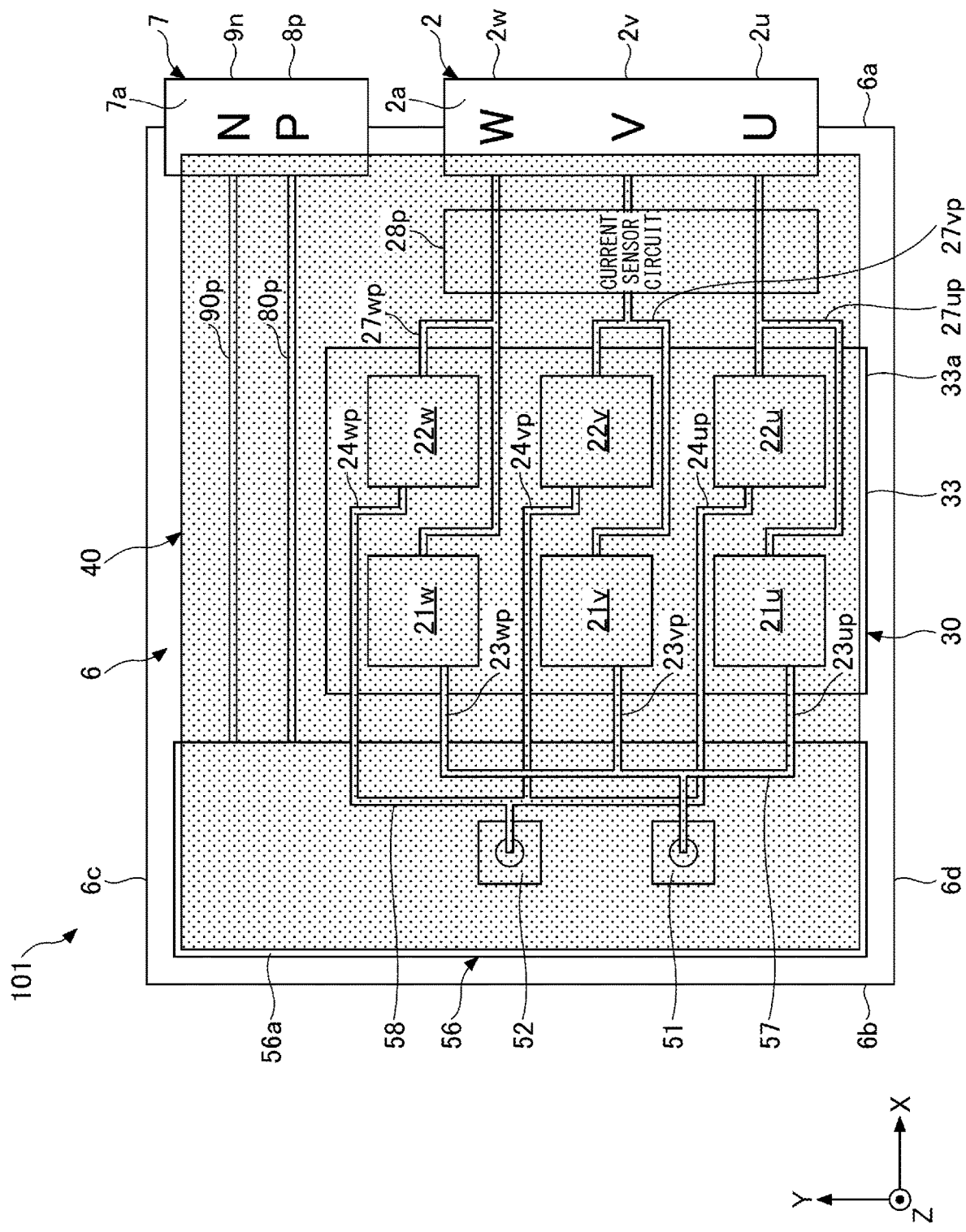
FIG. 6 is a plan view of an example of the first structure of the power converter according to one embodiment.

FIG. 5 is an exploded perspective view of the example of a first structure of the power converter according to one embodiment. FIG. 6 is a plan view of the example of the first structure of the power converter according to one embodiment. For convenience, illustration of the housing 6 is omitted in FIG. 5 in order to clarify the internal structure of the housing 6 that forms the outline of the power converter. The power converter 101 according to one embodiment, as illustrated in FIGS. 5 and 6, has the circuit configuration illustrated in FIG. 1.

The power converter 101 includes the housing 6, the power connector 7, the output connector 2, the capacitor 56, the switching elements 21*u*, 21*v*, 21*w*, 22*u*, 22*v*, and 22*w*, and the substrate 40. The power converter 101 includes a plurality of patterns such as the first positive pattern 80*p* and the like. The power converter 101 includes the current sensor circuit 28*p* and the cooler 30.

The housing 6 accommodates various internal components of the power converter 101 (in this case, the capacitor 56, the cooler 30, and the substrate 40 on which the switching element 21*u* and the like are mounted). In this example, the housing 6 is a hexahedral box, but another polyhedral box may be used. The housing 6 includes housing surfaces 6*a* and 6*b* facing each other in the X-axis direction, housing surfaces 6*c* and 6*d* facing each other in the Y-axis direction, and housing surfaces facing each other in the Z-axis direction. For example, the housing 6 has a configuration that includes a case to which various internal components are directly or indirectly attached and includes a cover that covers the various internal components on the case.

The power connector 7 is connected to a power supply harness not illustrated and is connected to a DC power supply not illustrated via the power supply harness. The output connector 2 is connected to the motor M2 (see FIG. 1) via an output harness not illustrated. In this example, the power connector 7 and the output connector 2 are separate members, but may be used as an integral member.

The power connector 7 is a component disposed on the side of the housing surface 6*a* so as to protrude from the housing surface 6*a*. The power connector 7 is exposed from the housing surface 6*a* of the housing 6 and is fixed to the housing surface 6*a*. The power connector 7 has the positive terminal 8*p* and the negative terminal 9*n*. The positive terminal 8*p* and the negative terminal 9*n* are exposed from the housing surface 6*a* of the housing 6.

The output connector 2 is a component disposed on the side of the housing surface 6*a* so as to protrude from the housing surface 6*a*. That is, the output connector 2 is disposed on the side of the housing surface 6*a*, as in the power connector 7. The output connector 2 is exposed from the housing surface 6*a* of the housing 6 and is fixed to the housing surface 6*a*. The output connector 2 has the output terminals 2*u*, 2*v*, and 2*w*. The output terminals 2*u*, 2*v*, and 2*w* are exposed from the housing surface 6*a* of the housing 6.

The capacitor 56 is accommodated in the housing 6. The capacitor 56 includes the first capacitor electrode 51 and the second capacitor electrode 52 that are disposed apart from each other in the Y-axis direction. The first capacitor electrode 51 is a terminal provided on the capacitor 56 in the negative Y-axis direction and protrudes from the capacitor surface 56*a* of the capacitor 56 in a positive Z-axis direction. The second capacitor electrode 52 is a terminal provided on the capacitor 56 in the positive Y-axis and protrudes from the capacitor surface 56*a* of the capacitor 56 in the positive Z-axis direction.

The switching elements 21*u*, 21*v*, and 21*w* are arranged side by side in the Y-axis direction. The switching elements 22*u*, 22*v*, and 22*w* are arranged side by side in the Y-axis direction so as to be on a side of the respective switching elements 21*u*, 21*v*, and 21*w* in the X-axis direction (in this example, the positive X-axis direction). The switching elements 21*u*, 21*v*, 21*w*, 22*u*, 22*v*, and 22*w* for power conversion are chip-type mounting parts on a given surface that is the bottom surface 46 of the substrate 40.

The substrate 40 includes the bottom surface 46 facing a top surface 33*a* of the cooler 30 and includes a top surface 47 opposite the bottom surface 46. For example, the drive circuit 18 and the control circuit 17 are mounted on the substrate 40. The drive circuit 18 drives the switching elements 21*u*, 21*v*, 21*w*, 22*u*, 22*v*, and 22*w* such that three-phase AC power is generated based on the control signals supplied from the control circuit 17.

The first positive pattern 80*p* forms a first positive line 80 (FIG. 1) that is electrically connected between the positive terminal 8*p* and the first capacitor electrode 51. The first positive pattern 80*p* is a conductive power line pattern formed on the substrate 40. The first negative pattern 90*p* forms the first negative line 90 (FIG. 1) that is electrically connected between the negative terminal 9*n* and the second capacitor electrode 52. The first negative pattern 90*p* is a conductive power line pattern formed on the substrate 40.

A second positive pattern 23*up*, a third positive pattern 23*vp*, and a fourth positive pattern 23*wp* form the second positive line 57 that is electrically connected between the first capacitor electrode 51 and each of the first main electrodes 23*u*, 23*v*, and 23*w*. A second positive pattern 23*up*, a third positive pattern 23*vp*, and a fourth positive pattern 23*wp* are conductive power line patterns formed on the substrate 40.

A second negative pattern 24*up*, a third negative pattern 24*vp*, and a fourth negative pattern 24*wp* form the second negative line 58 that is electrically connected between the second capacitor electrode 52 and each of the fourth main electrodes 24*u*, 24*v*, and 24*w*. A second negative pattern 24*up*, a third negative pattern 24*vp*, and a fourth negative pattern 24*wp* are conductive power line patterns formed on the substrate 40.

A U-phase pattern 27*up* forms the output line 1*u* (FIG. 1) that is electrically connected to the output terminal 2*u*, the second main electrode 25*u*, and the third main electrode 29*u*. A V-phase pattern 27*up* forms the output line 1*v* (FIG. 1) that is electrically connected to the output terminal 2*v*, the second main electrode 25*v*, and the third main electrode 29*v*. A W-phase pattern 27*wp* forms the output line 1*w* (FIG. 1) that is electrically connected to the output terminal 2*w*, the second main electrode 25*w*, and the third main electrode 29*w*. The U-phase pattern 27*up*, the V-phase pattern 27*vp*, and the W-phase pattern 27*wp* are conductive power line patterns formed on the substrate 40.

The current sensor circuit 28*p* detects the U-phase current flowing through the U-phase pattern 27*up*, detects the W-phase current flowing through the V-phase pattern 27*vp*, and detects the W-phase current flowing through the W-phase pattern 27*wp*. The current sensor circuit 28*p* is electrically connected to the control circuit 17 and outputs a current detection signal for each phase to the control circuit 17.

The cooler 30 cools the switching elements 21*u*, 21*v*, and 21*w* and the switching elements 22*u*, 22*v*, and 22*w*. The cooler 30 extends in the Y-axis direction and is located between the capacitor 56 and a set of input and output connectors (the power connector 7 and the output connector 2). The cooler 30 includes the cooling tube 33, the supply tube 34, and the discharge tube 35.

The cooling tube 33 extends in the Y-axis direction and has one or more flow passages through which the coolant such as cooling water flows. The supply tube 34 is a member that supplies the coolant flowing from an inlet port, to the cooling tube 33. The discharge tube 35 is a member that discharges the coolant flowing out of the cooling tube 33, from an outlet port.

The cooling tube 33 has a top surface 33*a* facing the bottom surface 46 of the substrate 40 in the Z-axis direction. When the top surface 33*a* of the cooler 30 contacts the switching elements 21*u*, 21*v*, 21*w*, 22*u*, 22*v*, and 22*w* (specifically, a back surface opposite to a given mounting surface), thermal exchange with the switching elements 21*u*, 21*v*, 21*w*, 22*u*, 22*v*, and 22*w* is enabled and thus cooling can be efficiently performed.

With this arrangement, the power converter 101 includes multiple lines that include a plurality of power lines that are each electrically connected to the capacitor 56, given switching elements, and the power connector 7. The multiple lines also include a plurality of output lines that are each electrically connected to a given switching element, among the multiple switching elements, and the output connector 2. At least one among these multiple lines is a line that includes a conductive pattern formed on the substrate 40.

Figure 7:
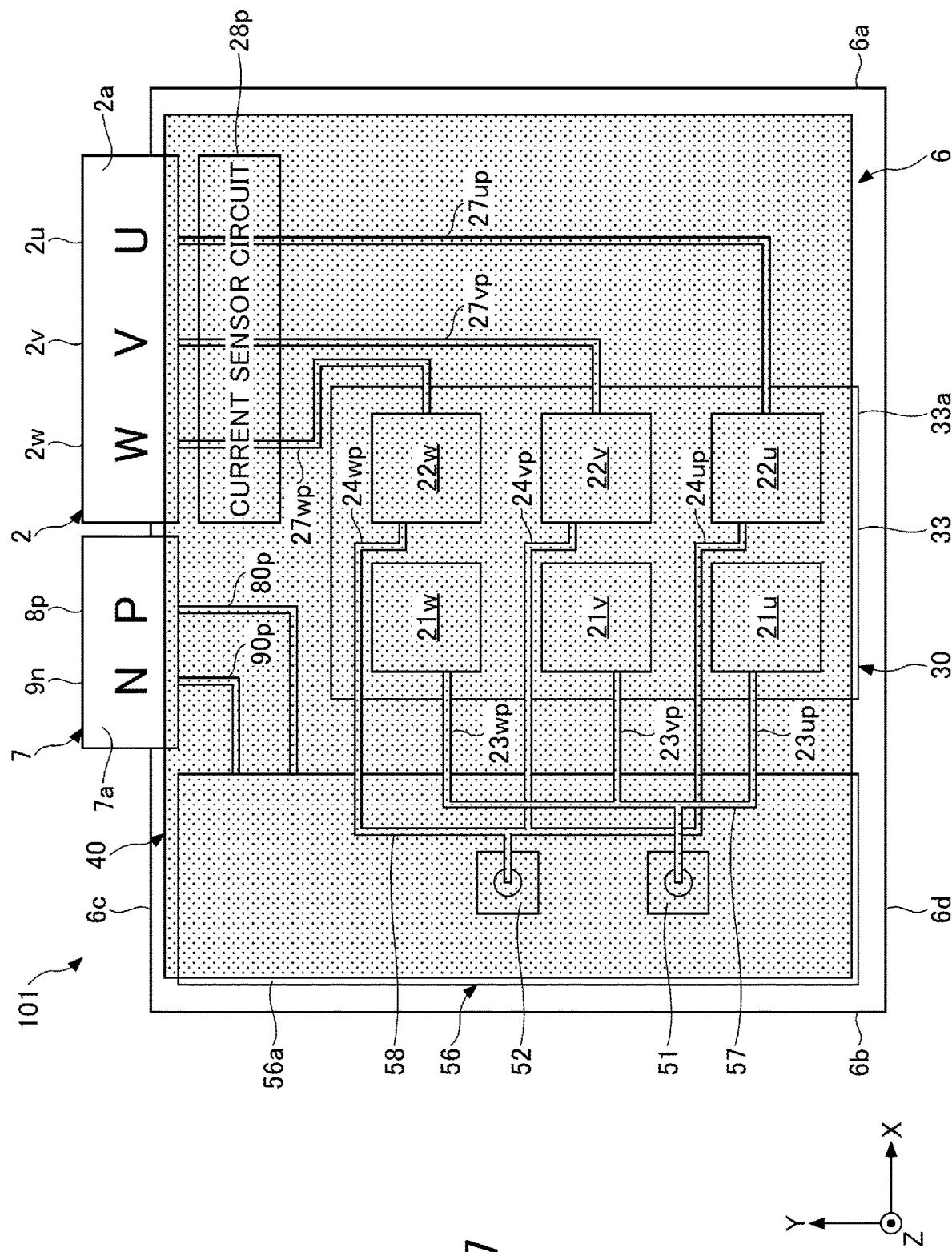
FIG. 7 is a plan view of an example of the second structure of the power converter according to one embodiment.

More specifically, in the power converter 101, a plurality of first power lines electrically connected between the power connector 7 and the capacitor 56 are lines each of which includes a conductive power line pattern formed on the substrate 40. In this example, the first power lines (the first positive line 80 and the first negative line 90) are lines that include respective conductive power line patterns (the first positive pattern 80*p* and the first negative pattern 90*p*) formed on the substrate 40. With this arrangement, when the power connector 7 is repositioned, it can be dealt with by changing the first positive pattern 80*p* and the first negative pattern 90*p*, and thus the design modification to be made due to the repositioning of the power connector 7 can be flexibly dealt with. For example, when the position of the power connector 7 is changed from the housing surface 6*a* (FIG. 6) of the housing 6 in the positive X-axis direction, to a housing surface 6*c* (FIG. 7) of the housing 6 in the positive Y-axis direction, it can be flexibly dealt with by changing the line layout of the first positive pattern 80*p* and the first negative pattern 90*p*. At least one among the first positive line 80 and the first negative line 90 may be a line that includes a conductive power line pattern formed on the substrate 40. Alternatively, both the first positive line 80 and the first negative line 90 may not be lines each of which includes a conductive power line pattern formed on the substrate 40.

In the power converter 101, a plurality of second power lines, which are each electrically connected between the capacitor 56 and a given switching element among the switching elements, are lines each of which includes a conductive power line pattern formed on the substrate 40. In this example, the second power lines (the second positive line 57 and the second negative electrode line 58) include conductive power line patterns (the second positive pattern 23*up*, the third positive pattern 23*vp*, the fourth positive pattern 23*wp*, the second negative pattern 24*up*, the third negative pattern 24*vp*, and the fourth negative pattern 24*wp*) formed on the substrate 40. With this arrangement, when the power connector 7 is repositioned, it can be dealt with by changing the second positive pattern 23*up* or the like, and thus the design modification to be made due to the repositioning of the power connector 7 can be flexibly dealt with. For example, when the position of the power connector 7 is changed from the housing surface 6*a* (FIG. 6) of the housing 6 in the positive X-axis direction to the housing surface 6*c* (FIG. 7) of the housing 6 in the positive Y-axis direction, it can be flexibly dealt with by changing the line layout of the second positive pattern 23*up* or the like. At least one among the second positive line 57 and the second negative line 58 may be a line that includes a conductive power line pattern formed on the substrate 40. Alternatively, the second positive line 57 and the second negative line 58 may not be lines that each of which includes a conductive power line pattern formed on the substrate 40.

In the power converter 101, a plurality of output lines, which are each electrically connected between the output connector 2 and a given switching element among the switching elements, are lines each of which includes a conductive output line pattern formed on the substrate 40. In this example, the output lines (output lines 1u, 1v, and 1w) include respective conductive output line patterns (U-phase pattern 27up, V-phase pattern 27vp, and W-phase pattern 27wp) formed on the substrate 40. With this arrangement, when the output connector 2 is repositioned, it can be dealt with by changing the U-phase pattern 27up, the V-phase pattern 27vp, and the W-phase pattern 27wp, and thus the design modification to be made due to the repositioning of the output connector 2 can be flexibly dealt with. For example, when the position of the output connector 2 is changed from the housing surface 6a (FIG. 6) of the housing 6 in the positive X-axis direction to the housing surface 6c (FIG. 7) of the housing 6 in the positive Y-axis direction, it can be flexibly dealt with by changing the line layout such as the U-phase pattern 27up or the like. At least one among the output lines 1u, 1v, and 1w may be a line that includes a conductive power line pattern formed on the substrate 40. Alternatively, the output lines 1u, 1v, and 1w may not be lines each of which includes the conductive power line pattern formed on the substrate 40.

The current sensor circuit 28p is a current sensor mounted on the substrate 40 and detects the current flowing through each of the U-phase pattern 27up, the V-phase pattern 27vp, and the W-phase pattern 27wp. By employing the current sensor circuit 28p, the design modification to be made due to the repositioning of the output connector 2 can be flexibly dealt with.

The capacitor 56 includes a plurality of capacitor electrodes (the first capacitor electrode 51 and second capacitor electrode 52) that are provided on a top surface (in this example, a capacitor surface 56a) facing the bottom surface 46 of the substrate 40. The first capacitor electrode 51 is electrically connected to power line patterns (in this example, the second positive pattern 23up, the third positive pattern 23vp, and the fourth positive pattern 23wp) of given multiple second power lines. The second capacitor electrode 52 is electrically connected to power line patterns (in this example, the second negative pattern 24up, the third negative pattern 24vp, and the fourth negative pattern 24wp) of given multiple second power lines. With this arrangement, the plurality of capacitor electrodes are each electrically connected to the power line patterns of given second power lines, and thus the design modification to be made due to the repositioning of the power connector 7 can be flexibly dealt with.

The substrate 40 also has the bottom surface 46 facing the top surface 33a of the cooler 30, and a plurality of switching elements that include the switching element 21u and the like are mounted on the bottom surface 46. With this arrangement, arrangement of the plurality of switching elements, including the switching element 21u and the like, on the bottom surface 46 can be easily changed. Therefore, the design modification to be made due to the repositioning of the power connector 7 or the output connector 2 can be flexibly dealt with.

The drive circuit 18 for driving a plurality of switching elements, including the switching element 21u and the like, may be mounted on a common substrate 40 to which a plurality of switching elements including the switching element 21u and the like are mounted, or may be mounted on another substrate. By mounting the drive circuit 18 on the substrate 40 that is commonly used for the plurality of switching elements including the switching element 21u and the like, the power converter 101 can made compact in comparison to the manner in which the drive circuit is mounted on another substrate.

The control circuit 17 that supplies the control signals to the drive circuit 18 may be mounted on the common substrate 40 on which a plurality of switching elements including the switching element 21u and the like are mounted, or may be mounted on another substrate. By mounting the control circuit 17 on the substrate 40 that is commonly used for the plurality of switching elements including the switching element 21u and the like, the power converter 101 can be made compact in comparison to a manner in which the control circuit is mounted on another substrate.

Figure 8:
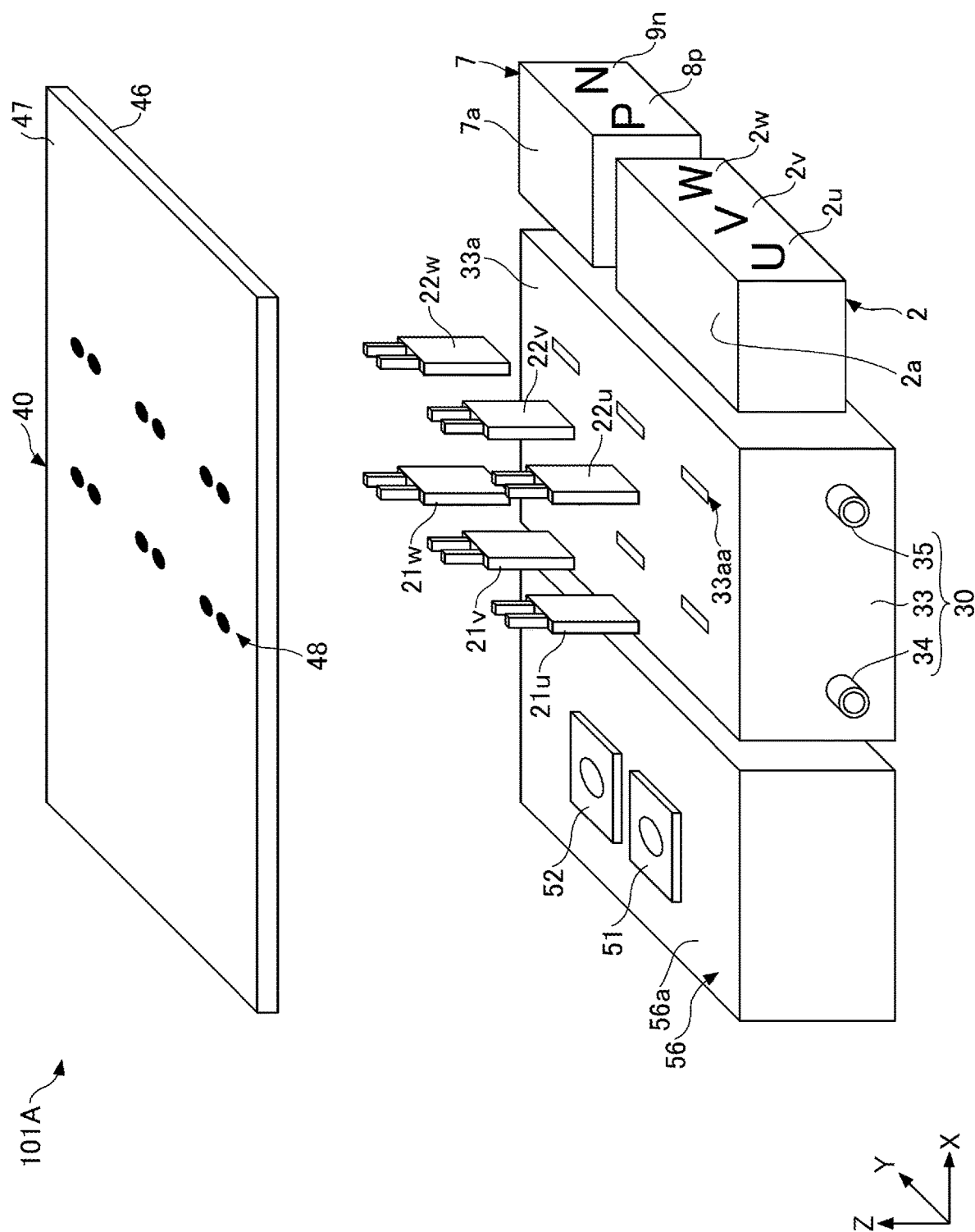
FIG. 8 is an exploded perspective view of an example of the power converter according to a first modification of the embodiment.

FIG. 8 is an exploded perspective view of the power converter in a first modification of the embodiment. A power converter 101A illustrated in FIG. 8 is described as the first modification of the power converter 101 described above. In FIG. 8, illustration of the conductive patterns formed on the substrate 40 is omitted.

The top surface 33a of the cooler 30 has recesses 33aa into which a plurality of switching elements 21u, 21v, 21w, 22u, 22v, and 22w are respectively inserted. By fixing the substrate 40 to the cooler 30 in a state in which the plurality of switching elements, including the switching element 21u and the like, are inserted into the respective recesses 33aa, the plurality of switching elements including the switching element 21u and the like can be efficiently cooled from the peripheries of the switching elements. Each recess 33aa may be a hole or a groove. In the configuration in FIG. 5, for a cooling system for the switching elements, single-side cooling is performed by thermal exchange with one surface of each switching element in contact with the cooler 30. In contrast, in the configuration in FIG. 8, for the cooling system for the switching elements, double-side cooling is performed by thermal exchange with each of at least two sides of each switching element. In this case, in comparison to the configuration in FIG. 5, the configuration in FIG. 8 improves cooling efficiency.

Figure 9:
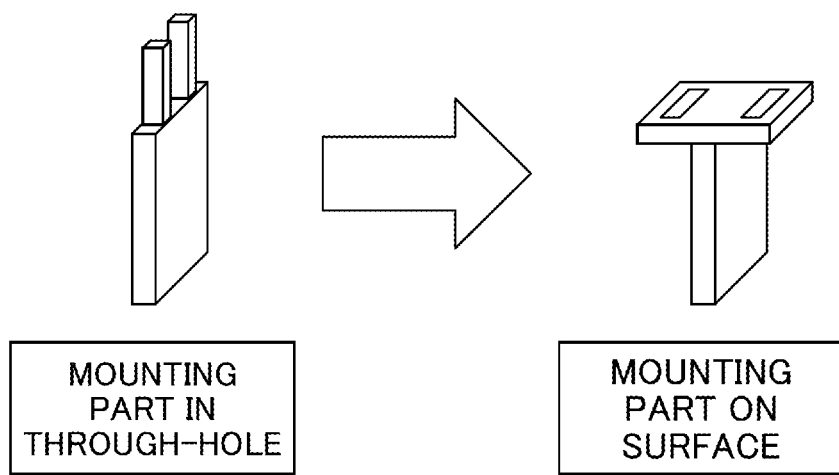
FIG. 9 is a perspective view of each switching element.

A plurality of switching elements, including the switching element 21u and the like illustrated in FIG. 8, are mounting parts that are mounted in respective through-holes and of which the longitudinal direction of each refers to the Z-axis direction. The switching elements are electrically bonded to respective through-holes 48 formed in the substrate 40, by soldering or the like. The plurality of switching elements, including the switching element 21u and the like, may be mounting parts of which the longitudinal direction of each refers to the Z-axis direction, as illustrated in FIG. 9.

Figure 10:
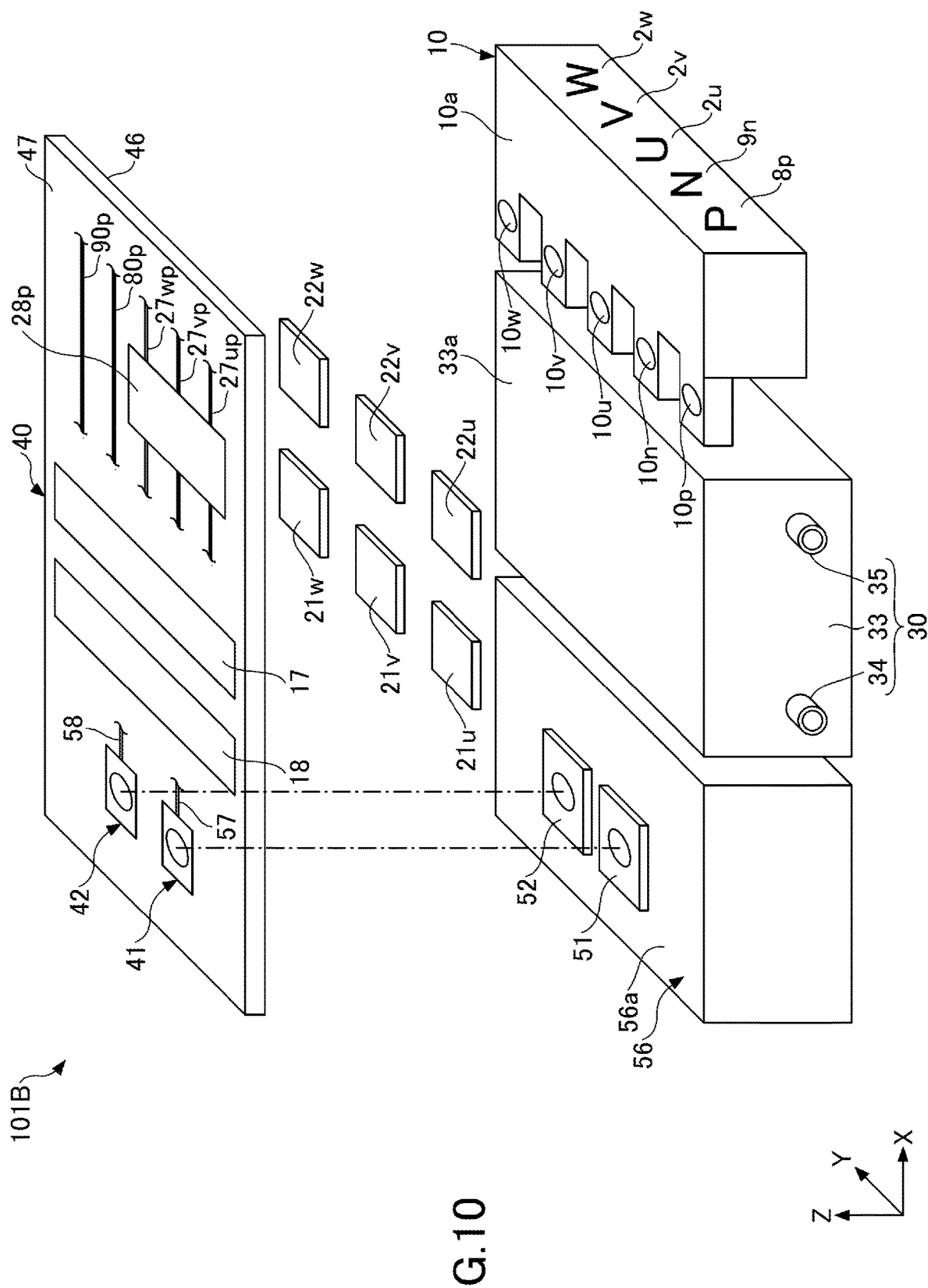
FIG. 10 is an exploded perspective view of an example of the power converter according to a second modification of the embodiment.
Figure 11:
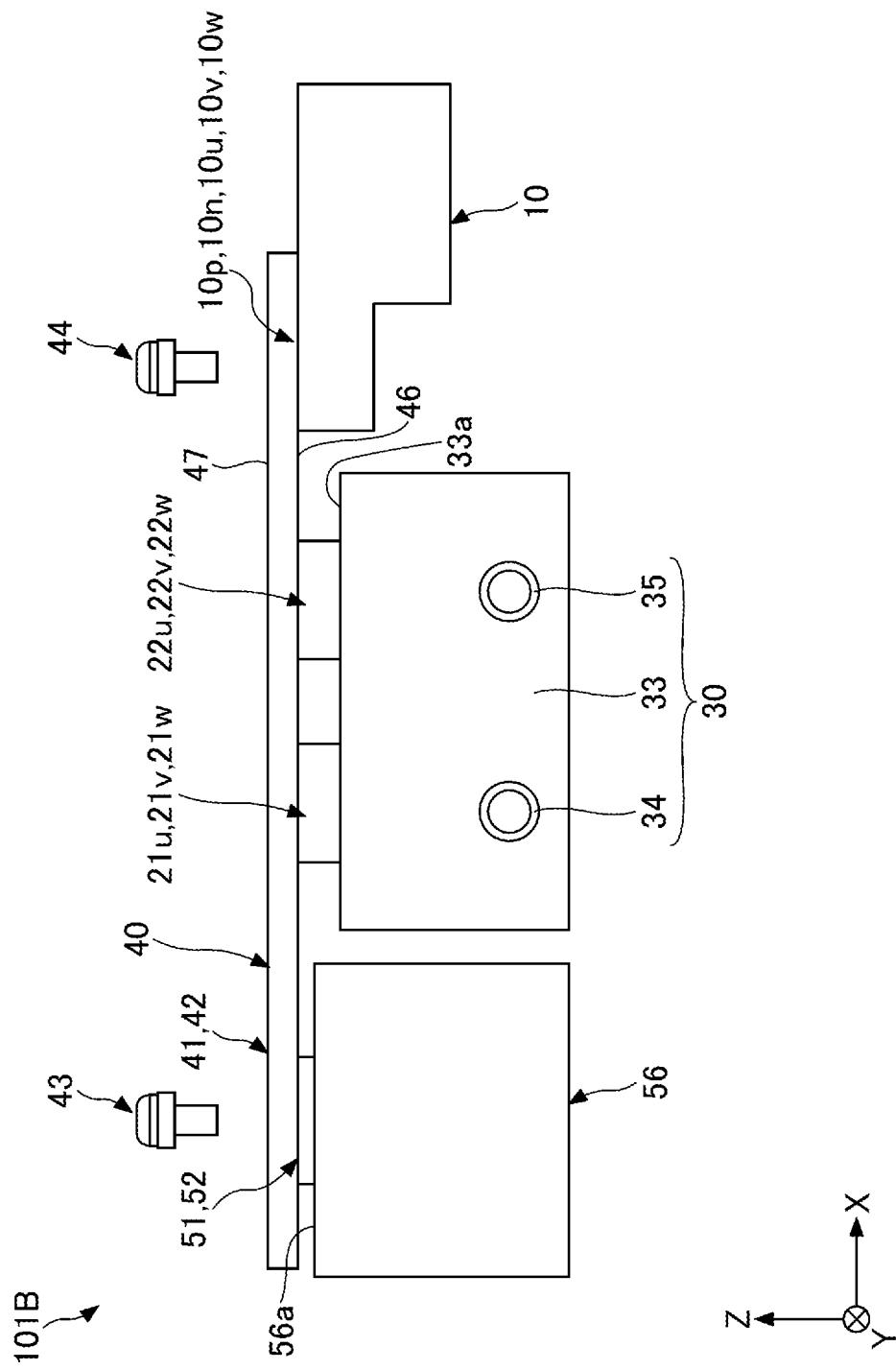
FIG. 11 is a front view of an example of the power converter according to the second modification of the embodiment.

FIG. 10 is an exploded perspective view of the power converter according to a second modification of the embodiment. FIG. 11 is a front view of the power converter according to the second modification of the embodiment. A power converter 101B illustrated in FIGS. 10 and 11 is described as the second modification of the power converter 101 described above. In FIG. 10, illustration of the second positive pattern 23up and the like formed on the substrate 40 is omitted. FIG. 10 illustrates the configuration in which the power connector 7 and the output connector 2 are used as an integral member, but their connectors may be separate members.

The connector 10 is a member in which the power connector 7 and the output connector 2 are integrated, and is mounted on the bottom surface 46 of the substrate 40. The connector 10 has a plurality of terminals electrically connected to respective conductive patterns of lines that are formed on the substrate 40. The connector 10 includes the positive terminal 8p, the negative terminal 9n, and the output terminals 2u, 2v, and 2w, and includes a plurality of connection terminals 10p, 10n, 10u, 10v, and 10w. The connection terminals 10p, 10n, 10u, 10v, and 10w are electrodes that are electrically connected to the positive terminal 8p, the negative terminal 9n, and the output terminals 2u, 2v, and 2w, respectively. The connection terminals 10p, 10n, 10u, 10v, and 10w are provided on a connector surface 10a of the connector 10 in the positive Z-axis direction.

The connector 10 and the substrate 40 are fixed to each other by one or more first fixing members. In this example, the connector 10 and the substrate 40 are fastened to each other by fastening members 44 such as screws. The connection terminals 10p, 10n, 10u, 10v, and 10w are electrically connected to conductive patterns of a plurality of lines via conductive first fixing members such as fastening members 44, respectively. With this arrangement, the conductive first fixing members can be shared when a mechanical connection and an electrical connection are performed. The connection terminals 10p, 10n, 10u, 10v, and 10w are electrically connected to the first positive pattern 80p, the first negative pattern 90p, the U-phase pattern 27up, the V-phase pattern 27vp, and the W-phase pattern 27wp, respectively.

For example, the fastening members 44 that are external screws are respectively inserted into multiple internal screw holes, each of which is formed in a given connection terminal among the connection terminals 10p, 10n, 10u, 10v, and 10w, where the external screws are also respectively inserted into multiple substrate through-holes formed in the substrate 40. With this arrangement, the connector 10 and the substrate 40 are fastened, and the connection terminals 10p, 10n, 10u, 10v, and 10w are electrically connected to the first positive pattern 80p, the first negative pattern 90p, the U-phase pattern 27up, the V-phase pattern 27vp, and the W-phase pattern 27wp, respectively. The connection terminals 10p, 10n, 10u, 10v, and 10w may be electrically connected to respective lands not illustrated that are formed on the bottom surface 46 of the substrate 40.

The substrate 40 and the capacitor 56 are fixed to each other by second fixing members. In this example, the substrate 40 and the capacitor 56 are fastened to each other by fastening members 43 such as screws. The first capacitor electrode 51 and the second capacitor electrode 52 are electrically connected to power line patterns of the plurality of second power lines via second conductive fixing members such as fastening members 43, respectively. With this arrangement, the conductive second fixing members can be shared when the mechanical connection and electrical connection are performed. The capacitor electrode 51 is electrically connected to the first substrate electrode 41 formed on the substrate 40, and the second capacitor electrode 52 is electrically connected to the second substrate electrode 42 formed on the substrate 40. The first substrate electrode 41 is electrically connected to given conductive power line patterns that form the second positive line 57, and the second substrate electrode 42 is electrically connected to given conductive power line patterns that form the second negative electrode line 58.

For example, the fastening member 43 that is an external screw is inserted into an internal screw hole formed in the first capacitor electrode 51 and a substrate through-hole formed in the first substrate electrode 41. With this arrangement, the substrate 40 and the capacitor 56 are fastened to each other, and the first capacitor electrode 51 and the first substrate electrode 41 are electrically connected together. Similarly, the fastening member 43 that is an external screw is inserted into an internal screw hole formed in the second capacitor electrode 52 and a substrate through-hole formed in the second substrate electrode 42. With this arrangement, the substrate 40 and the capacitor 56 are fastened to each other, and the second capacitor electrode 52 and the second substrate electrode 42 are electrically connected together. The first capacitor electrode 51 and the second capacitor electrode 52 may be electrically connected to respective lands not illustrated formed on the bottom surface 46 of the substrate 40.

Although not illustrated, the first positive pattern 80p and the first negative pattern 90p may be electrically connected to respective electrodes disposed in the capacitor 56, via second fixing members, respectively, as in the second positive line 57 and second negative line 58 and the first capacitor electrode 51 and second capacitor electrode 52. With this arrangement, the second conductive fixing members can be shared when the mechanical connection and electrical connection are performed.

Figure 12:
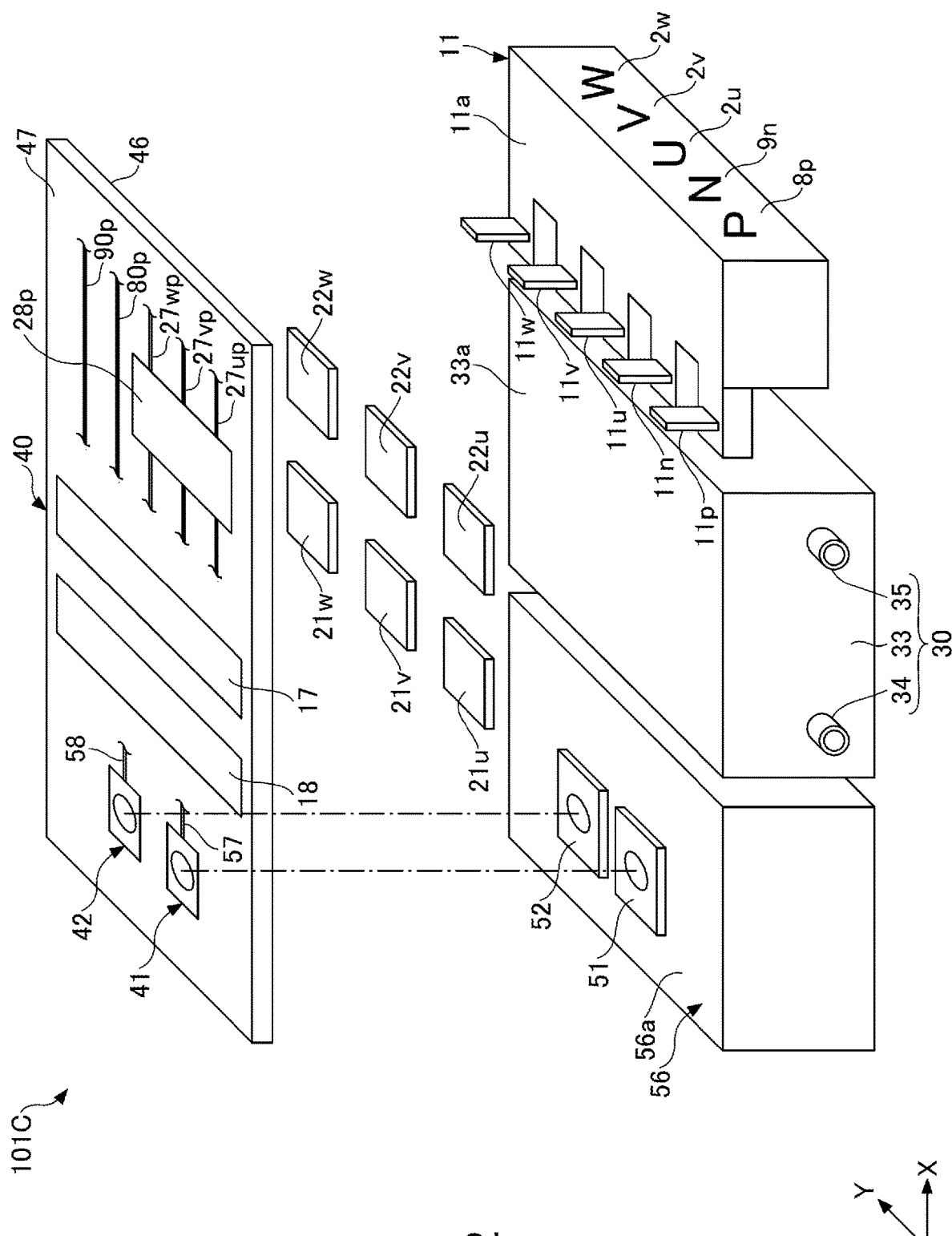
FIG. 12 is an exploded perspective view of an example of the power converter according to a third modification of the embodiment.

FIG. 12 is an exploded perspective view of the power converter according to a third modification of the embodiment. A power converter 101C illustrated in FIG. 12 is described as the third modification of the power converter 101 described above. The connector 11 according to the third modification includes a plurality of lead terminals 11p, 11n, 11u, 11v, and 11w, instead of the plurality of connection terminals 10p, 10n, 10u, 10v, and 10w of the connector 10 according to the second modification.

The lead terminals 11p, 11n, 11u, 11v, and 11w are fixed to through-holes not illustrated formed in the substrate 40, through conductive first fixing members such as solder, respectively, and thus the connector 11 and the substrate 40 are fixed to each other.

FIG. 13 is a front view of the power converter according to a fourth modification of the embodiment. A power converter 101D illustrated in FIG. 13 is described as the fourth modification of the power converter 101 described above. In the fourth modification, the connection terminals 10p, 10n, 10u, 10v, and 10w are electrically connected to the first positive pattern 80p, the first negative pattern 90p, the U-phase pattern 27up, the V-phase pattern 27vp, and the W-phase pattern 27wp, through conductive busbars 12, respectively. The busbars 12 are fastened at one end each of the busbars to the connection terminals 10p, 10n, 10u, 10v, and 10w through fastening members 45 such as screws, respectively. The other ends of the busbars 12 are electrically connected to the first positive pattern 80p, the first negative pattern 90p, the U-phase pattern 27up, the V-phase pattern 27vp, and the W-phase pattern 27wp, through conductive fastening members 44 (each of which is one example of a first fixing member) such as screws, respectively.

Although the power converter has been described according to the embodiments, the present disclosure is not limited to the embodiments described above. Various changes and modifications, such as combinations and substitutions with some or all of the other embodiments, can be made within the scope of the present disclosure.

For example, the power converter in the present disclosure is not limited to an inverter that generates a three-phase alternating current, and may be an inverter that generates an alternating current other than the three-phase alternating current.

The power converter in the present disclosure is not limited to an inverter that converts DC into AC, and may be a converter that converts DC into DC. A specific example of such a power converter includes a boost voltage converter that boosts an input voltage and outputs the boosted voltage, a buck voltage converter that steps down an input voltage and outputs a lowered voltage, or a boost and buck converter that boosts or steps down an input voltage and outputs it.

What is claimed is:

1. A power converter comprising:
   a capacitor;
   a substrate on which a plurality of switching elements for power conversion are mounted;
   a cooler configured to cool the plurality of switching elements;
   a housing that accommodates the substrate and the cooler;
   a connection exposed from the housing; and
   a plurality of lines each electrically connected to the capacitor, given switching elements, and the connection,
   wherein at least one among the plurality of lines includes a conductive pattern formed on the substrate.

2. The power converter according to claim 1, further comprising:
   a drive circuit configured to drive at least one of the plurality of switching elements,
   wherein the substrate has a top surface and a bottom surface facing a top surface of the cooler,
   wherein the plurality of switching elements are mounted on the bottom surface of the substrate, and
   wherein the drive circuit is mounted on the top surface of the substrate.

3. The power converter according to claim 2, wherein the top surface of the cooler contacts the plurality of switching elements.

4. The power converter according to claim 1, wherein each switching element of the plurality of switching elements is a surface-mounted part that includes a chip.

* * * * *